United States Patent Office 2,746,848

Patented May 22, 1956

2,746,848

ETCHING

Rexford W. Jones, Columbus, Ohio, assignor, by mesne assignments, to Photo-Engravers Research, Inc., Savannah, Ga., a corporation of Georgia No Drawing. Application January 19, 1955, Serial No. 482,869

10 Claims. (Cl. 41—42)

This invention relates to etching of metals. More particularly, it relates to the production of a relief image on the surface of photoengraving metal plates by means of etching, wherein etching of the side walls of the relief supporting metal is retarded. This invention is concerned not only with the etching process, but also with the etching bath.

In making a relief printing surface on photoengraving copper or brass, the image to be printed is photomechanically transferred to and developed on a light-sensitive coating on the metal surface. The exposed area of the coating, which is referred to as a resist, adheres to the surface of the metal, while the area of the coating not struck by light is easily removed therefrom. The resist is so named because of its resistance to attack by the etching bath. The etching bath conventionally used in the case of photoengraving copper or brass objects, such as printing plates, is an aqueous solution of ferric chloride. As is well known in the art, copper for photoengraving purposes preferably is of high purity, though it may contain small amounts of other metals to impart increased hardness. In the case of brass for photoengraving purposes, the average proportions of two parts copper and one part zinc offer the most common brass used. The proportions may vary depending upon the work to be done. In general, the higher the copper content, the smoother the etching proceeds.

The metal bearing the photoresist is contacted with the ferric chloride etching solution. This may be done by immersing the metal and the resist affixed thereto in the etching solution. Alternatively the solution may be splashed so that it randomly impinges against the metal and the resist. The ferric chloride etching solution attacks the metal where the metal surface is not protected by the resist and, by chemical action, removes the metal. The metal surface protected by the resist is not subject to a direct attack by the etching solution. As the etching proceeds, the resist-covered portions of the metal stand out in vertical relief. As the depth of the etch increases, the sides of the metal supporting the resist are exposed to the etching solution. The ferric chloride etching solution then attacks the exposed metal side walls and undercuts the resist around its edges. If not skillfully controlled, this undercutting results in a printing surface which is not a true representation of the image transferred to the sensitized metal.

Accordingly, it is readily apparent that the side walls of the metal supporting the resist must be protected against attack from the etching solution. Heretofore, an effective way to protect against side etching has been to coat the side walls of the printing elements supporting the resist with an etching-resistant powder. This protective powder is applied to the printing elements before a significant amount of side etching has occurred. In the technique of powdering, the engraving is removed from the contact with the ferric chloride etching solution and is rinsed and dried. The powder is then applied to the printing elements, as by brushing, taking care to cover the side walls of the metal supporting the resist. The powder is then "burnt in" to form a coating which will protect the side walls against further etching. The engraving with the printing elements thus protected by the powdering is then given an additional etch. This etch increases the depth of the prior etch without substantial attack on the side walls. Additional alternate etching and powdering steps are continued, depending on the character of the resist and the depth of etch required. The powdering treatment requires considerable time and the exercise of a great amount of skill, because care must be taken that the powder adheres only to the sides of the relief, rather than on the bottom area of the etched portion of the plate. Should the powder adhere to the bottom area of the plate, a rough etch is obtained that is detrimental to the printing operation.

An object of this invention is the etching of metal whereby side etching or undercutting is substantially reduced or eliminated. Another object of this invention is to provide an etching composition which will form a protective film on the metal during etching, whereby the necessity for a separate protective treatment of the metal, as by powdering, may be eliminated. Other objects and advantages will become apparent from the following detailed description of the invention.

The invention of what may be called automatic side-wall protection during the etching operation is obtained by the incorporation of thiourea in the ferric chloride etching solution. The presence of the thiourea causes the formation of an etch-resistant film on the etched metal surface. This etch-resistant film can be preferentially removed or dislodged from the bottom portion of the etched areas during the etching operation by controlling the manner in which the etching solution is brought into contact with the metal. By removing or dislodging the film from the bottom portion of the etched areas, or preventing the adherence of the film to the bottom portions of the etched areas, it is possible to obtain unidirectional etching normal to the surface of the metal, while retarding or preventing substantial side-wall etching in a direction lateral to the surface of the metal. Because the etch-resistant film is deposited on all of the exposed metal, etching is essentially halted in a quiescent bath of ferric chloride containing the thiourea. The formation of the etch-resistant film may be disrupted at the bottom portions of the etched areas, and removed therefrom, without substantially affecting the formation of the etch-resistant film on the side walls of the etched areas, by brushing, by splashing, or by forced flow of the etching solution against the metal as the etching proceeds. By the use of thiourea in the ferric chloride etching solution, it is possible to favorably increase the etch factor over that obtainable by using straight ferric chloride solution, that is, ferric chloride solution without the addition of thiourea. The etch factor is the ratio of the depth of the etch measured adjacent to a line of resist to the side etch measured at the top of the surface of the relief image beneath the line of resist. The etch factor is a means of evaluating the unidirectional etching characteristics of etching solutions. Obviously, the higher the etch factor, the more efficient is the downward etching relative to the side etching.

In the practice of this invention, thiourea usually obtained in powdered form can be dissolved directly in the ferric chloride etching solution, or the thiourea can be dissolved in water and the water solution of thiourea added to the etching solution. When the thiourea or thiourea solution is first added to the ferric chloride solution, there is a slight darkening of the solution. The solution returns to its original color after several minutes, and there are no visible physical indications that an additive has been incorporated in the ferric chloride etching solution. In the use of the etching solution of this invention, the major factors to be considered are the concentration of the thiourea, the age of the etching solution after incorporation of the thiourea, the manner of contacting the metal surface with the etching solution, as referred to above, and, of course, the concentration of the ferric chloride. All of these factors are interdependent for desired optimum etching conditions.

In regard to the concentration of the thiourea in the etching solution, with the other factors remaining constant, the larger the amount of thiourea that is used, the greater is the formation of the etch-resistant film. An excessive amount of the thiourea is not desirable in that an unduly thick film will deposit on the metal, thereby unduly decreasing the rate of etching or even completely preventing the continuation of the etching. On the other hand, if insufficient thiourea is present in the etching solution, the film formed on the etched metal will not be of sufficient thickness to be etch-resistant. Because of the various factors involved, including the nature of the work to be etched, it is difficult to specify concentrations of the thiourea which would be optimum for all operating conditions. In general, the concentration of the thiourea in the aqueous ferric chloride etching solution may vary from about 0.4 gram per liter to about 10.0 grams per liter of the etching solution depending on etching conditions. In most instances, only a small amount of thiourea is sufficient, such as about 0.8 to about 2.0 grams per liter of the etching solution.

if the age of the etching solution containing thiourea increases over 120 hours.

Advantageously, the ferric chloride etching solutions used in the practice of this invention, that is, with the addition of thiourea, may be of the same concentrations of ferric chloride as is conventionally used in the photoengraving industry. The concentration of the ferric chloride may vary from 30° Baumé to 46° Baumé. In most photoengraving work, the concentration of ferric chloride normally used will vary from 40° to 42° Baumé.

The following table presents a number of representative etching tests using the ferric chloride etchant with and without the use of thiourea. In each of the examples, the work specimen consists of a cross-in-circle image. In each example, a plate of photoengraving copper is coated with a conventional light-sensitive enamel and then exposed through a photographic negative having transparent lines of a cross-in-circle image. After the exposure, the plate is developed, thereby producing lines of resist corresponding to the cross-in-circle image of the photographic negative. The remaining portion of the plate is bare metal. Each specimen then is subjected to the etching procedure designated in the table and described below. The data of the table in conjunction with the description set forth below show the interrelated effects of concentration of the thiourea, age of the etchant containing the thiourea, and the manner in which the plate is contacted with the etchant.

*Table*

| Example No. | Application of etchant | Concentration of thiourea, grams per liter | Age of etchant after incorporation of thiourea, hours | Agitation, R. P. M. | Etching time, minutes | Depth of etch, thousandths of an inch | Etch factor |
|---|---|---|---|---|---|---|---|
| 1 | Splash | 0 | | 1,530 | 6 | 5.8 | 1.4 |
| 2 | do | 0 | | 1,530 | 5.5 | 5.0 | 1.7 |
| 3 | do | 1 | ¼ | 1,530 | 9 | 5.0 | 2.5 |
| 4 | do | 1 | 1 | 1,530 | 10 | 5.9 | 2.4 |
| 5 | do | 2 | 1 | 1,530 | 10 | 2.8 | 2.9 |
| 6 | do | 2 | 70 | 1,530 | 10 | 5.4 | 3.1 |
| 7 | do | 2 | 96 | 1,530 | 10 | 6.1 | 1.8 |
| 8 | do | 3 | 20 | 1,530 | 10 | 2.6 | 2.7 |
| 9 | do | 3 | 21 | 1,830 | 10 | 3.9 | 2.2 |
| 10 | do | 3 | 26 | 2,050 | 10 | 6.3 | 3.5 |
| 11 | Brushed | 0 | | | 10 | 6 | 1.5 |
| 12 | do | 10 | Fresh | | 15 | 9 | 3.0 |
| 13 | Spray | 0 | | | 2.67 | 4.5 | 1.7 |
| 14 | do | 1.8 | Fresh | | 2.75 | 2.7 | 6.0 |
| 15 | Jet Stream | 0 | | | 2.75 | 8.6 | 3.2 |
| 16 | do | 0.8 | Fresh | | 4 | 10.4 | 11.0 |
| 17 | do | 0.4 | do | | 2.67 | 8.3 | 4.4 |
| 18 | do | 1.2 | (1) | | 5 | 30.0 | 7.6 |
| 19 | do | 1.2 | (1) | | 4.67 | 19.4 | 11.7 |
| 20 | do | 1.2 | (1) | | 2.75 | 15.3 | 6.2 |
| 21 | do | 2.0 | (2) | | 2.82 | 13.2 | 12.5 |
| 22 | do | 2.0 | (3) | | 4.17 | 14.8 | 33.0 |

[1] Approximately 2 hours after the etchant of Example 17 was prepared, 0.8 g. of additional thiourea was added and used in these examples.
[2] Approximately 4 hours after the addition to the etchant of Examples 18 to 20, 0.8 g. of additional thiourea was added and used in this example.
[3] Same etchant of Example 21, approximately 21 hours after last addition of thiourea.

In regard to the age of the etching solution of this invention, that is, the aqueous ferric chloride solution containing thiourea, the solution is most effective in forming an etch-resistant film on copper material shortly after being added to the etching solution, and then becomes gradually less effective as the etching solution ages. This decrease in the film-forming characteristics of the solution is not understood. The thiourea apparently does not combine with the ferric chloride or in any way alter the etching action of the ferric chloride, since, after a given period of time, which depends on the amount of thiourea initially incorporated in the etching solution, the etching characteristics of the ferric chloride etching solution are the same as if the addition of thiourea had not been made. A further addition of thiourea can be made to the etching solution and, again, the desired film-forming characteristics of the etching solution are obtained. In general, no improved etch factor is obtained over the use of a straight ferric chloride etching solution, In Examples 1 to 10, using ferric chloride at 42° Baumé, the etching solution is splashed upwardly against the work specimen by means of a rotary paddle. The rate of rotation of the paddle for each example is listed under the "Agitation" column in the table. Comparison of the etch factor for Examples 1 and 2 with the etch factor for Examples 3 to 10 shows that the use of thiourea in the ferric chloride etching solution produces an improvement in the etch factor.

In Examples 11 and 12 using ferric chloride at 40° Baumé, the work specimen is immersed in the etching solution. The solution is agitated by means of a bristle brush which is brushed across and in contact with the surface of the work to be etched. The improved etch factor obtained by brushing the etching solution containing the thiourea is seen from the table.

In Examples 13 and 14, using ferric chloride at 40° Baumé, the etching solution is directed against the work to be etched in the form of an atomized spray. The atomizer nozzle, placed about 3 inches away from the surface of the work to be etched, is directed to cause an atomized spray to impinge upwardly and substantially perpendicularly against the specimen. The spray is continued for the time indicated in the table under a pressure of about 20 p. s. i. air pressure. The improved etch factor obtainable by the use of the thiourea is again apparent from the table.

In Examples 15 to 22, using ferric chloride at 42° Baumé, a nonatomized jet stream of the etching solution is directed downwardly and substantially perpendicularly against the surface of the work to be etched. The force of the etchant stream is that sufficient to prevent puddling of the etchant on the work specimen. The jet stream nozzle is spaced from the work specimen so that the jet stream does not break up or splatter before contacting the work specimen. A distance of ½ inch to 1 inch between the nozzle and the work specimen provides a satisfactory jet stream with nozzle openings ranging in size from 0.035 inch to 0.070 inch in diameter. Again, the tabulated etch factor for the examples using thiourea in the ferric chloride etching solution is improved over the etch factor of Example 13, wherein no thiourea was used. In addition, the tabulated data in the table show that the jet-stream method of impinging the etching solution against the work specimen is the most effective method of obtaining an improved etch factor.

Microscopic inspection of the specimens etched with the etching solution containing the thiourea disclosed a pronounced, more gradual sloping of the side walls than the side walls of the specimens etched with the straight ferric chloride. The gradual side-wall slope produced by the etching solution of this invention indicates the tendency for the etch-resistant film to protect the side walls from etching. The film is a gelatinous-appearing film and is probably the formation of a complex compound between the copper ions and the thiourea in solution. The film has the necessary concomitant characteristics of being etch-resistant and being capable of adhering satisfactorily to the side walls while being capable of being removed or dislodged from the bottom portions of the etch. Although the examples specifically disclose removing or dislodging the etch-resistant film from the bottom portions of the etch simultaneously during the etching action, it is to be understood that other means of removal may be practiced. For example, the work to be etched may be immersed in a quiescent etching solution of this invention, removed therefrom, and then subjected to such means as air streams or liquid streams to preferentially remove the etch-resistant film from the bottom of the etch, and then repeating this process to obtain the desired depth of etch necessary for the work at hand. Whatever means are used for contacting the solution with the work to be etched, the etching solution of this invention substantially reduces side etch and provides an economical and rapid means for etching relief plates for printing. It is to be understood that the term photoengraving copper includes copper and brass as conventionally used in the photoengraving art.

What is claimed is:

1. An aqueous ferric chloride etching solution containing thiourea, said thiourea being present in amounts from about 0.4 to 10.0 grams per liter of the solution.

2. In a process of etching protoengraving copper having a portion of its surface masked with a resistant coating, the step of contacting both the masked and the unmasked portions of said surface with an equeous ferric chloride etching solution containing thiourea.

3. In a process of etching photoengraving copper having a portion of its surface masked with a resistant coating, the step of contacting both the masked and the unmasked portions of said surface with an aqueous ferric chloride solution containing thiourea, said thiourea being present in amounts of from 0.4 to 10.0 grams per liter of solution.

4. In a process of etching photoengraving copper having a portion of its surface masked with a resistant coating, the step of impinging upon both the masked and the unmasked portions of said surface an aqueous ferric chloride etching solution containing thiourea.

5. In the process of claim 4 wherein the thiourea is present in an amount of from about 0.4 gram to about 10.0 grams per liter of etching solution.

6. In a process of etching photoengraving copper having a portion of its surface masked with a resistant coating, the step of impinging in a substantially perpendicular direction upon both the masked and the unmasked portions of said surface an aqueous ferric chloride etching solution containing thiourea.

7. In the process of claim 6 wherein the thiourea is present in an amount of from about 0.4 gram to about 10.0 grams per liter of etching solution.

8. In a process of etching photoengraving copper having a portion of its surface masked with a resistant coating, the step of impinging in a substantially perpendicular direction upon both the masked and the unmasked portions of said surface a jet stream of an aqueous ferric chloride etching solution containing thiourea.

9. In the process of claim 8 wherein the thiourea is present in an amount of from about 0.4 gram to about 10.0 grams per liter of etching solution.

10. In the process of claim 8 wherein the thiourea is present in an amount of from about 0.8 gram to about 2.0 grams per liter of etching solution.

References Cited in the file of this patent

UNITED STATES PATENTS

| | | |
|---|---|---|
| 1,608,622 | Schmidt et al. | Nov. 30, 1926 |

FOREIGN PATENTS

| | | |
|---|---|---|
| 458,968 | Great Britain | Dec. 30, 1936 |
| 634,401 | Great Britain | Mar. 22, 1950 |